(12) United States Patent
Cencula et al.

(10) Patent No.: US 11,609,280 B2
(45) Date of Patent: Mar. 21, 2023

(54) LEAKAGE DETECTION FOR ELECTRONIC DEVICE

(71) Applicant: Liquid Robotics, Inc., Sunnyvale, CA (US)

(72) Inventors: Christopher D. Cencula, Roseville, CA (US); Casper G. Otten, Santa Clara, CA (US)

(73) Assignee: Liquid Robotics, Inc., Sunnyvale, CA (US)

( * ) Notice: Subject to any disclaimer, the term of this patent is extended or adjusted under 35 U.S.C. 154(b) by 60 days.

(21) Appl. No.: 17/280,505

(22) PCT Filed: Sep. 28, 2018

(86) PCT No.: PCT/US2018/053623
§ 371 (c)(1),
(2) Date: Mar. 26, 2021

(87) PCT Pub. No.: WO2020/068131
PCT Pub. Date: Apr. 2, 2020

(65) Prior Publication Data
US 2021/0341548 A1    Nov. 4, 2021

(51) Int. Cl.
    *G01R 31/52*    (2020.01)
(52) U.S. Cl.
    CPC .................... *G01R 31/52* (2020.01)
(58) Field of Classification Search
    CPC .... G01R 31/50; G01R 31/52; G01R 27/2605; G01D 5/24
    See application file for complete search history.

(56) References Cited

U.S. PATENT DOCUMENTS

| 6,096,062 A * | 8/2000 | Silvian ................. A61N 1/3937 |
| | | 607/5 |
| 8,112,240 B2 * | 2/2012 | Fennell ................. G01R 31/52 |
| | | 702/116 |

(Continued)

FOREIGN PATENT DOCUMENTS

| CN | 102645606 A * | 8/2012 | ............ B60L 3/0069 |
| JP | 3960350 B1 * | 8/2007 | ............ B60L 3/0069 |

(Continued)

OTHER PUBLICATIONS

EPO International Search Report and Written Opinion, dated Jul. 3, 2019, regarding International Application No. PCT/US2018/053623, 8 pages.

*Primary Examiner* — Patrick Assouad
*Assistant Examiner* — Demetrius R Pretlow
(74) *Attorney, Agent, or Firm* — Yee & Associates, P.C.

(57) ABSTRACT

A method of detecting a leakage path in an electronic device includes iteratively performing operations until an iteration condition is satisfied. The operations include causing a capacitor to be set to a known state, measuring a voltage level of the capacitor, and storing data indicating the measured voltage level. The operations also include causing the capacitor to be connected to a potential leakage path, remeasuring the voltage level of the capacitor, and storing data indicating the remeasured voltage level. The operations further include comparing the measured voltage level and the remeasured voltage level to detect leakage in the potential leakage path. The iteration condition is satisfied when a difference between the measured voltage level and the remeasured voltage level satisfies a voltage threshold or when a count of iterations performed satisfies an iteration threshold.

20 Claims, 9 Drawing Sheets

(56) References Cited

U.S. PATENT DOCUMENTS

| | | | | |
|---|---|---|---|---|
| 2007/0177417 A1* | 8/2007 | Corulli | ............ | G11C 29/50016 365/145 |
| 2008/0079416 A1* | 4/2008 | Kawamura | ............ | G01R 31/40 324/76.11 |
| 2012/0112771 A1* | 5/2012 | Schliebe | ................ | G01R 31/52 324/686 |
| 2012/0153966 A1* | 6/2012 | Kawamura | ............ | G01R 31/64 324/548 |
| 2012/0262183 A1* | 10/2012 | Kawamura | ............ | G01R 31/52 324/509 |
| 2013/0063152 A1* | 3/2013 | Kasashima | ............ | G01R 31/52 324/509 |
| 2013/0342215 A1* | 12/2013 | Kawamura | ............ | G01R 31/08 324/509 |
| 2015/0293167 A1* | 10/2015 | Kawamura | ............ | B60L 3/0069 324/551 |
| 2016/0091552 A1* | 3/2016 | Yasukawa | ............ | G01R 31/007 324/503 |
| 2016/0377670 A1* | 12/2016 | Tamida | .................. | G01R 31/34 324/551 |
| 2017/0108544 A1* | 4/2017 | Schmelzer | ............ | G01R 27/025 |
| 2017/0197508 A1* | 7/2017 | Kobayashi | ............ | B60L 3/0046 |
| 2018/0067158 A1* | 3/2018 | Kawamura | ............ | G01R 31/389 |
| 2019/0100104 A1* | 4/2019 | Kawamura | ............ | G01R 31/14 |
| 2019/0225088 A1* | 7/2019 | Masuda | .................... | B60L 3/12 |

FOREIGN PATENT DOCUMENTS

| | | | | | |
|---|---|---|---|---|---|
| JP | 2016025794 | A | * | 2/2016 | |
| WO | 2013126427 | A1 | | 8/2013 | |
| WO | WO-2015111692 | A1 | * | 7/2015 | ........... G01R 31/025 |
| WO | 2020068131 | A1 | | 4/2020 | |

\* cited by examiner

LEAKAGE DETECTION FOR ELECTRONIC DEVICE

CROSS-REFERENCE TO RELATED APPLICATION

This application is related to and claims the benefit of priority of International Application No. PCT/US2018/053623, entitled, "Leakage Detection for Electronic Device", filed on Sep. 28, 2018, which is hereby incorporated by reference.

BACKGROUND INFORMATION

1. Field

The present disclosure is related to detecting a leakage path in an electronic device.

2. Background

Some electronic devices are designed for use in (or configured to be operable in) water or other conductive media. As a non-limiting example, an electronic device can include an underwater sensor that is integrated as part of an underwater wireless sensing system. The underwater wireless sensing system can be used for a variety of applications and industries. To illustrate, underwater wireless sensing system applications can include instrument monitoring applications, pollution control applications, climate recording applications, search and survey applications, marine life applications, etc.

In some scenarios, when an electronic device or system is in or exposed to a conductive medium, current leakage (e.g., a ground fault) can occur due to wiring faults or due to the conductive media entering cabling, connectors or housing of the electronic device or system. For example, there may be inadvertent contact between an energized conductor and ground caused by water entering the housing of the electronic device. If a ground fault is not detected, the ground fault can negatively impact operations of the electronic device or system. For example, the ground fault can reduce signaling reliability, sensing reliability, etc. In other scenarios, the ground fault can result in more serious defects of the electronic device, such as increased corrosion of metallic components (e.g., connectors), or device failure. Ground faults are often of concern with respect to safety—shock prevention, short circuit prevention etc. Some electronic/electrical systems are designed with isolation between portions of the system, such as in industrial equipment and machinery or vehicles like electric cars where the system is designed to provide isolation between high voltage portions of the system and low voltage or 'chassis' of the vehicle or equipment. Detecting faults in the isolation of these systems may be important for both safety and reliability.

SUMMARY

According to one implementation of the present disclosure, a method of detecting a leakage path in an electronic device includes iteratively, until an iteration condition is satisfied, performing operations including causing a capacitor to be set to a known state, measuring a voltage level of the capacitor, and storing data indicating the measured voltage level. The operations also include causing the capacitor to be connected to a potential leakage path, remeasuring the voltage level of the capacitor, and storing data indicating the remeasured voltage level. The operations further include comparing the measured voltage level and the remeasured voltage level to detect leakage in the potential leakage path. The iteration condition is satisfied when a difference between the measured voltage level and the remeasured voltage level satisfies a voltage threshold or when a count of iterations performed satisfies an iteration threshold.

According to another implementation of the present disclosure, an apparatus includes a circuit for testing a potential leakage path in an electronic device, where the circuit includes a capacitor. The apparatus also include a controller operable to execute firmware to iteratively, until an iteration condition is satisfied, perform operations including causing the capacitor to be set to a known state, measuring a voltage level of the capacitor, and storing data indicating the measured voltage level. The operations also include causing the capacitor to be connected to the potential leakage path, remeasuring the voltage level of the capacitor, and storing data indicating the remeasured voltage level. The operations further include comparing the measured voltage level and the remeasured voltage level to detect leakage in the potential leakage path. The iteration condition is satisfied when a difference between the measured voltage level and the remeasured voltage level satisfies a voltage threshold or when a count of iterations performed satisfies an iteration threshold.

According to another implementation of the present disclosure, a non-transitory computer-readable medium includes firmware that, when executed by a controller of an electronic device, causes the controller to iteratively, until an iteration condition is satisfied, perform operations including causing a capacitor to be set to a known state, measuring a voltage level of the capacitor, and storing data indicating the measured voltage level. The operations also include causing the capacitor to be connected to a potential leakage path, remeasuring the voltage level of the capacitor, and storing data indicating the remeasured voltage level. The operations further include comparing the measured voltage level and the remeasured voltage level to detect leakage in the potential leakage path. The iteration condition is satisfied when a difference between the measured voltage level and the remeasured voltage level satisfies a voltage threshold or when a count of iterations performed satisfies an iteration threshold.

DETAILED DESCRIPTION

Figure 1:
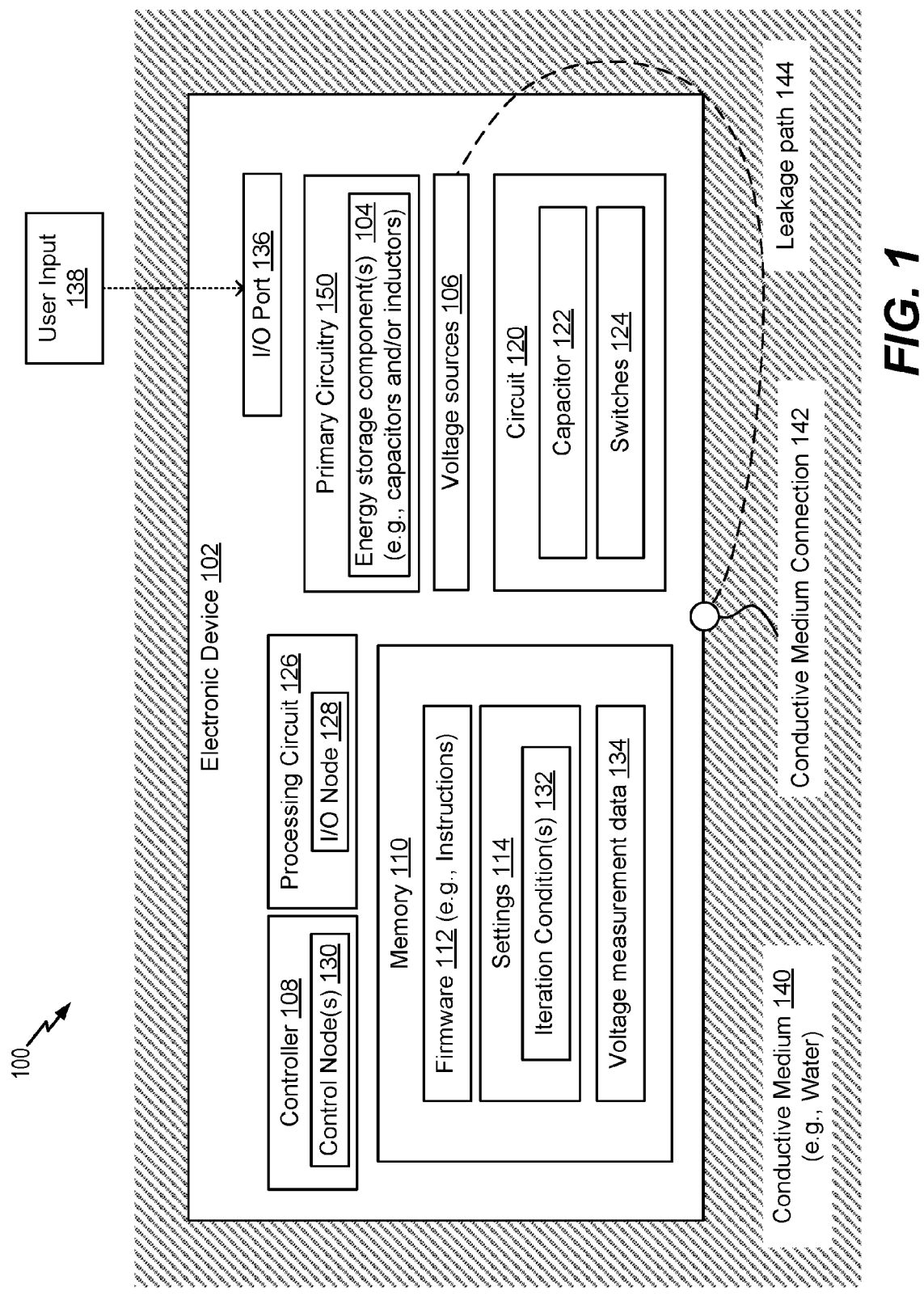
FIG. 1 is a diagram of system including an electronic device with a circuit for detecting a leakage path.

Particular embodiments of the present disclosure are described below with reference to the drawings. In the description, common features are designated by common reference numbers throughout the drawings.

The figures and the following description illustrate specific exemplary embodiments. It will be appreciated that those skilled in the art will be able to devise various arrangements that, although not explicitly described or shown herein, embody the principles described herein and are included within the scope of the claims that follow this description. Furthermore, any examples described herein are intended to aid in understanding the principles of the disclosure and are to be construed as being without limitation. As a result, this disclosure is not limited to the specific embodiments or examples described below, but by the claims and their equivalents.

Particular implementations are described herein with reference to the drawings. In the description, common features are designated by common reference numbers throughout the drawings. In some drawings, multiple instances of a particular type of feature are used. Although these features are physically and/or logically distinct, the same reference number is used for each, and the different instances are distinguished by addition of a letter to the reference number. When the features as a group or a type are referred to herein (e.g., when no particular one of the features is being referenced), the reference number is used without a distinguishing letter. However, when one particular feature of multiple features of the same type is referred to herein, the reference number is used with the distinguishing letter. For example, referring to FIG. 2, multiple switches are illustrated and associated with reference numbers 124A, 124B, 124C, etc. When referring to a particular one of these switches, such as a first switch 124A, a distinguishing letter "A" is used. However, when referring to any arbitrary one of these switches or to these switches as a group, the reference number 124 is used without a distinguishing letter.

As used herein, various terminology is used for the purpose of describing particular implementations only and is not intended to be limiting. For example, the singular forms "a," "an," and "the" are intended to include the plural forms as well, unless the context clearly indicates otherwise. Further, the terms "comprise," "comprises," and "comprising" are used interchangeably with "include," "includes," or "including." Additionally, the term "wherein" is used interchangeably with the term "where." As used herein, "exemplary" indicates an example, an implementation, and/or an aspect, and should not be construed as limiting or as indicating a preference or a preferred implementation. As used herein, an ordinal term (e.g., "first," "second," "third," etc.) used to modify an element, such as a structure, a component, an operation, etc., does not by itself indicate any priority or order of the element with respect to another element, but rather merely distinguishes the element from another element having a same name (but for use of the ordinal term). As used herein, the term "set" refers to a grouping of one or more elements, and the term "plurality" refers to multiple elements.

As used herein, "generating", "calculating", "using", "selecting", "accessing", and "determining" are interchangeable unless context indicates otherwise. For example, "generating", "calculating", or "determining" a parameter (or a signal) can refer to actively generating, calculating, or determining the parameter (or the signal) or can refer to using, selecting, or accessing the parameter (or signal) that is already generated, such as by another component or device. As used herein, "coupled" can include "communicatively coupled," "electrically coupled," or "physically coupled," and can also (or alternatively) include any combinations thereof. Two devices (or components) can be coupled (e.g., communicatively coupled, electrically coupled, or physically coupled) directly or indirectly via one or more other devices, components, wires, buses, networks (e.g., a wired network, a wireless network, or a combination thereof), etc. Two devices (or components) that are electrically coupled can be included in the same device or in different devices and can be connected via electronics, one or more connectors, or inductive coupling, as illustrative, non-limiting examples. In some implementations, two devices (or components) that are communicatively coupled, such as in electrical communication, can send and receive electrical signals (digital signals or analog signals) directly or indirectly, such as via one or more wires, buses, networks, etc. As used herein, "directly coupled" is used to describe two devices that are coupled (e.g., communicatively coupled, electrically coupled, or physically coupled) without intervening components.

The techniques described herein enable detection of a leakage path (or ground fault) in circuitry of an electronic device. In a particular implementation, the electronic device includes a controller coupled to a circuit that includes a plurality of switches and a floating capacitor. The controller executes firmware to operate the circuit through a number of operational states in order to detect current leakage from a component within the electronic device to a conductive medium around the electronic device. For example, the controller can cause the capacitor to be charged then couple the charged capacitor to a potential leakage path. If the voltage level of the capacitor drops due to the capacitor being connected to the potential leakage path, this can be an indication of a ground fault (e.g., current leakage to the conductive medium). However, in some implementations, the electronic device includes other energy storage devices in addition to the capacitor. In such implementations, the voltage level in the capacitor can decrease as a result of charge carriers being transferred between the capacitor and another energy storage device. To illustrate, if the potential leakage path includes a second capacitor and the capacitor is charged to a higher voltage level than the second capacitor, charge can be transferred from the capacitor to the second capacitor when the capacitor is coupled to the potential leakage path. In this situation, a decrease in the voltage level of the capacitor due to being coupled to the potential leakage path would not be indicative of a ground fault.

To mitigate effects of this situation, the controller uses an iterative process to detect a leakage path. The iterative process includes comparing a voltage level of the capacitor when it has been set to a known state to the voltage level of the capacitor after it has been coupled to a potential leakage path. Thus, in the iterative process, the controller sets the capacitor to a known state (e.g., a specified voltage level or a discharged state). If the electronic device includes another energy storage device (e.g., a capacitor or inductor), the other energy storage device may allow current to flow to the capacitor if the known state is at a voltage level less than a voltage level of the energy storage device. To mitigate the effects of such current flow, an entire set of circuitry to be tested, including the capacitor, the other energy storage device, and other circuitry of the potential leakage path, can be discharged (or at least partially discharged) before beginning the iterative process.

FIG. 1 is a diagram of system 100 including an electronic device 102 with a circuit 120 for detecting a leakage path 144 (e.g., a current leakage path). In the particular implementation illustrated, the electronic device 102 includes, is surrounded by, or is submerged in a conductive medium 140. The conductive medium 140 can include a component of the electronic device 102, such as a chassis of the electronic device 102, that is intended to be electrically isolated from electrical components of the electronic device 102. Alternatively, or in addition, the conductive medium 140 can be part of the environment in which the electronic device 102 operates such as the metal chassis of a vehicle or metallic equipment in an industrial setting. For example, the electronic device 102 can include a floating or submersible electronic device, such as an aquatic vehicle (e.g., a manned, autonomous, or remotely piloted surface or submersible vehicle), a sensor package, etc. In such implementations, the leakage path 144 can be present due to a ground fault that allows current to flow from a voltage source 106 of the electronic device 102 to the conductive medium 140. Thus, the circuit 120 and associated components of the electronic device 102 act as a ground fault detector to detect ground faults in the electronic device 102 by detecting the presence of the leakage path 144.

The electronic device 102 includes primary circuitry 150, which includes electronic components and circuitry configured to facilitate operation of the electronic device 102. The specific configuration of the primary circuitry 150 depends on the design and functional characteristics of the electronic device 102. For example, if the electronic device 102 is self-propelled, the primary circuitry 150 can include one or more motors, one or more actuators (e.g., steering actuators), etc. In various implementations, the primary circuitry 150 can include sensors, communications devices, control systems of the electronic device 102, tools (e.g., manipulator arms, lifting devices, cargo handling devices, etc.), navigation systems, other electronic devices for sensing or changing aspects of the electronic device 102, other electronic devices for sensing or interacting with an environment around the electronic device 102, or a combination thereof. The configuration of the primary circuitry 150 can be changed from time to time, e.g., based on specific mission requirements. In some configurations, the primary circuitry 150 includes one or more energy storage components 104, such as one or more capacitors, one or more inductors, or a combination thereof.

In the example illustrated in FIG. 1, the electronic device 102 also includes a circuit 120 that includes a capacitor 122 and a plurality of switches 124. The circuit 120 is coupled to one or more control nodes 130 of a controller 108 and to an input/output (I/O) node 128 of a processing circuit 126. Although the controller 108 and the processing circuit 126 are shown in FIG. 1 as separate components, in some implementations, the controller 108 and the processing circuit 126 are combined in a single component, such as a microprocessor. A specific example of the circuit 120, including connections to the control node(s) 130 and to the I/O node 128, is described with reference to FIGS. 2-7.

The control node(s) 130 are configured to control operation of the switches 124 (e.g., to open or close each switch) based on an operational state of the circuit 120. In the particular example illustrated in FIGS. 1-7, the I/O node 128 is configured to provide a voltage with a specified voltage level to the capacitor 122 when the I/O node is in an output state and is configured to measure a voltage level of the capacitor 122 when the I/O node is in an input state. In other implementations, the processing circuit 126 can include separate input and output nodes, in which case the switches 124 can be used to selectively couple the capacitor 122 to the input node or the output node.

The controller 108 and the processing circuit 126 are coupled to a memory 110. In the example illustrated in FIG. 1, the memory 110 stores firmware 112 (e.g., instructions), settings 114, and voltage measurement data 134. In other implementations, the electronic device 102 can include more than one memory device, in which case the firmware 112, the settings 114, and the voltage measurement data 134 can be stored in different memory devices. To illustrate, the firmware 112 can be stored in a non-volatile memory device, the voltage measurement data 134 can be stored in a volatile memory device, and the settings 114 can be stored in the non-volatile memory device, in the volatile memory device, or in another memory device.

In a particular implementation, the controller 108 can execute the firmware 112 to control operation of the circuit 120, the processing circuit 126, other components of the electronic device 102, or a combination thereof. With regard to detecting the leakage path, the controller 108, executing the firmware 112, can control actuation of the switches 124 via the control node(s) 130. In the example illustrated in FIG. 1, the controller 108 can also cause the processing circuit 126 to selectively set the I/O node 128 to an input mode of operation or to an output mode of operation.

The settings 114 specify parameters used by the controller 108 to control operation of the circuit 120 to detect the leakage path 144. For example, in FIG. 1, the settings 114 include one or more iteration conditions 132, which are described further below. In other example, the settings 114 can specify one or more other parameters, such as a voltage level to be output by the I/O node 128 when the I/O node 128 is in the output mode. In some implementations, the settings 114 can be modified or updated in response to user input 138 received via an I/O port 136 of the electronic device 102. For example, the settings 114 can be updated to account for configuration changes in the primary circuitry 150. To illustrate, in a first configuration of the primary circuitry 150, the primary circuitry 150 may include a first set of energy storage components 104 or no energy storage components; whereas in a second configuration, the primary circuitry 150 may include a second set of energy storage components 104. In this illustrative example, the settings 114 can be modified, via the user input 138, to change operation of the controller 108 to account for the change in the primary circuitry 150. In the illustrative example, settings 114 can be configurable via user input 138 based on a configuration of electronic device 102.

During operation to detect the leakage path 144, the controller 108 executing the firmware 112 can cause the capacitor 122 to be set to a known state. For example, the capacitor 122 can be at least partially discharged by coupling the capacitor 122 to a ground. If the primary circuitry 150 includes the energy storage component(s) 104, the energy storage component(s) 104 can also be at least partially discharged so that current does not flow from the energy storage component(s) 104 to the capacitor 122. Setting the capacitor 122 to a known state can also, or in the alternative, include providing a voltage with a specified voltage level to the capacitor 122. To illustrate, the I/O node 128 can be set to an output mode and coupled (via actuation of one or more of the switches 124) to the capacitor 122 to apply voltage to the capacitor 122.

After the capacitor 122 is set to the known state, the processing circuit 126 can measure a voltage level of the capacitor 122 and store data indicating the voltage level in the voltage measurement data 134. For example, the I/O node 128 can be set to an input mode and coupled (via actuation of one or more of the switches 124) to the capacitor 122 to measure the voltage level of the capacitor 122.

The capacitor 122 is subsequently coupled, via operation of one or more of the switches 124, between a portion of the primary circuitry 150 and a conductive medium connection 142. In this context, the portion of the primary circuitry 150 includes or corresponds to a potential leakage path of one of the voltage sources 106 to the conductive medium. The conductive medium connection 142 is exposed to the conductive medium 140. If the leakage path 144 exists between a voltage source 106 and the conductive medium 140 via the potential leakage path, coupling the capacitor 122 to the potential leakage path of the primary circuitry 150 completes the circuit and enables current to flow from the capacitor 122, which reduces the voltage level of the capacitor 122.

After the capacitor 122 is coupled to the potential leakage path, the capacitor 122 is disconnected from the potential leakage path and the voltage level of the capacitor 122 is remeasured. Data indicating the remeasured voltage level is stored in the voltage measurement data 134. The data indicating the voltage level after the capacitor 122 is set to the known state (also referred to herein as the "measured voltage level" as distinct from the remeasured voltage level) is compared to the data indicating the remeasured voltage level. As explained above, a difference between the measured voltage level and the remeasured voltage level may indicate presence of the leakage path 144. However, in some implementations, such as when the primary circuitry 150 includes the energy storage component(s) 104, the difference between the measured voltage level and the remeasured voltage level can be at least partially due to current flow from the capacitor 122 to the energy storage component(s) 104 or from the energy storage component(s) 104 to the capacitor 122.

To reduce the effect on detecting the leakage path 144 of current flow between the capacitor 122 and the energy storage component(s) 104, several of the operations described above can be iteratively repeated until one or more iteration conditions 132 are satisfied. For example, after at least partially discharging the capacitor 122 and the energy storage component(s) 104, the controller 108 can perform an iterative process that includes setting the capacitor 122 to a known state, measuring the voltage level of the capacitor 122, coupling the capacitor 122 to the potential leakage path, remeasuring the voltage level of the capacitor 122, and comparing the measured voltage level and the remeasured voltage level. In a particular implementation, an iterative condition of the iteration conditions 132 is satisfied when the difference between the measured voltage level and the remeasured voltage level is less than or equal to the voltage threshold. In this implementation, the voltage threshold is sufficiently low such that the difference between the measured voltage level and the remeasured voltage level being less than or equal to a voltage threshold indicates that there is no significant leakage path 144 between the conductive medium connection 142 and the voltage sources 106. Alternatively, or in addition, an iterative condition of the iteration conditions 132 is satisfied when a particular number of iterations performed satisfies an iteration count threshold. In this implementation, the iteration count reaching the iteration count threshold without any iteration resulting in the difference between the measured voltage level and the remeasured voltage level being less than or equal to a voltage threshold indicates the presence of the leakage path 144. In some implementations, the controller 108 can generate an indication of presence (or absence) of the leakage path 144. For example, the controller 108 can output data to a user or to another device via the I/O port 136.

The number of iterations needed to reliably determine that a leakage path 144 is present (or absent) can vary depending on the specific configuration of the primary circuitry 150, depending on the voltage sources 106, or both. For example, in a first configuration, the primary circuitry 150 can include a relatively small-capacity energy storage component 104 (e.g., a small capacitor), and in a second configuration, the primary circuitry 150 can include a relatively large-capacity energy storage component 104 (e.g., a large capacitor). Assuming the capacitor 122 used to detect leakage is the same for each configuration of the primary circuitry 150, more iterations may be needed to confirm the presence (or absence) of the leakage path 144 for the second configuration than for the first configuration because the capacitor 122 may need to be charged and discharged to the large capacitor multiple times to equalize the voltage level of the capacitor 122 and the large capacitor. In contrast, due to the smaller capacity of the small capacitor, the capacitor 122 can be charged and discharged to the small capacitor fewer times to equalize the voltage level of the capacitor 122 and the small capacitor.

Accordingly, the circuit 120 in conjunction with the controller 108 and the processing circuit 126 enables reliable detection of leakage paths (e.g., ground faults) in the electronic device 102. Further, using the settings 114 as parameters for the firmware 112 to control a leakage detection process allows the circuit 120 to be used to detect leakage paths for a variety of configurations of the primary circuitry 150 of the electronic device 102.

FIGS. 2-7 are diagrams illustrating an example of the circuit 120 in a various operational states. In the example illustrated in FIGS. 2-7, the circuit 120 includes the capacitor 122 and the switches 124, including a first switch 124A, a second switch 124B, a third switch 124C, a fourth switch 124D, a fifth switch 124E, a sixth switch 124F, a seventh switch 124G, and an eighth switch 124H. The switches 124 are coupled to the control nodes 130, including a first control node 130A, a second control node 130B, a third control node 130C, a fourth control node 130D, a fifth control node 130E, and a sixth control node 130F. The control nodes 130 control actuation of the switches 124. In the particular example illustrated in FIGS. 2-7, the switches are electro-optical switches (e.g., PhotoMOS relays), each including a light emitting diode (LED) and a photo-electric element. In this example, when the LED of a particular switch 124 is active (e.g., outputting light) the photo-electric element of the switch 124 allows current flow (e.g., closes the switch 124), and when the LED of a particular switch 124 is inactive (e.g., not outputting light) the photo-electric element of the switch 124 inhibits current flow (e.g., opens the switch 124). In other implementations, one or more of the switches 124 can be an electrical switch (e.g., a transistor), an electromechanical switch (e.g., a relay), or another switch-type that is controllable by the controller 108, such as a pneumatic switch.

The circuit 120 is coupled via the first switch 124A to a first voltage source 106A and via the second switch 124B to a second voltage source 106B. In the example illustrated in FIGS. 2-7, the second voltage source 106B is a ground. The circuit 120 is also coupled, via the third switch 124C to the conductive medium connection 142. The fourth switch 124D, when closed, provides a resistive path to at least partially discharge the primary circuitry 150, which can be coupled to the circuit 120 between the first switch 124A and the first voltage source 106A, between the second switch 124B and the second voltage source 106B, or both. The fifth switch 124E is coupled to a first terminal of the capacitor 122 and to ground, such as a ground rail coupled to the second voltage source 106B or another ground. The sixth switch 124F is coupled to a second terminal of the capacitor 122 and to the ground, such as a ground rail coupled to the second voltage source 106B or another ground. The seventh switch 124G is coupled to the I/O node 128 and to the first terminal of the capacitor 122. The eighth switch 124H is coupled to the I/O node 128 and to the second terminal of the capacitor 122. In the example illustrated in FIGS. 2-7, the circuit 120 also includes a transient voltage suppressor 202 coupled in parallel to the capacitor 122 to reduce voltage spikes.

Figure 2:
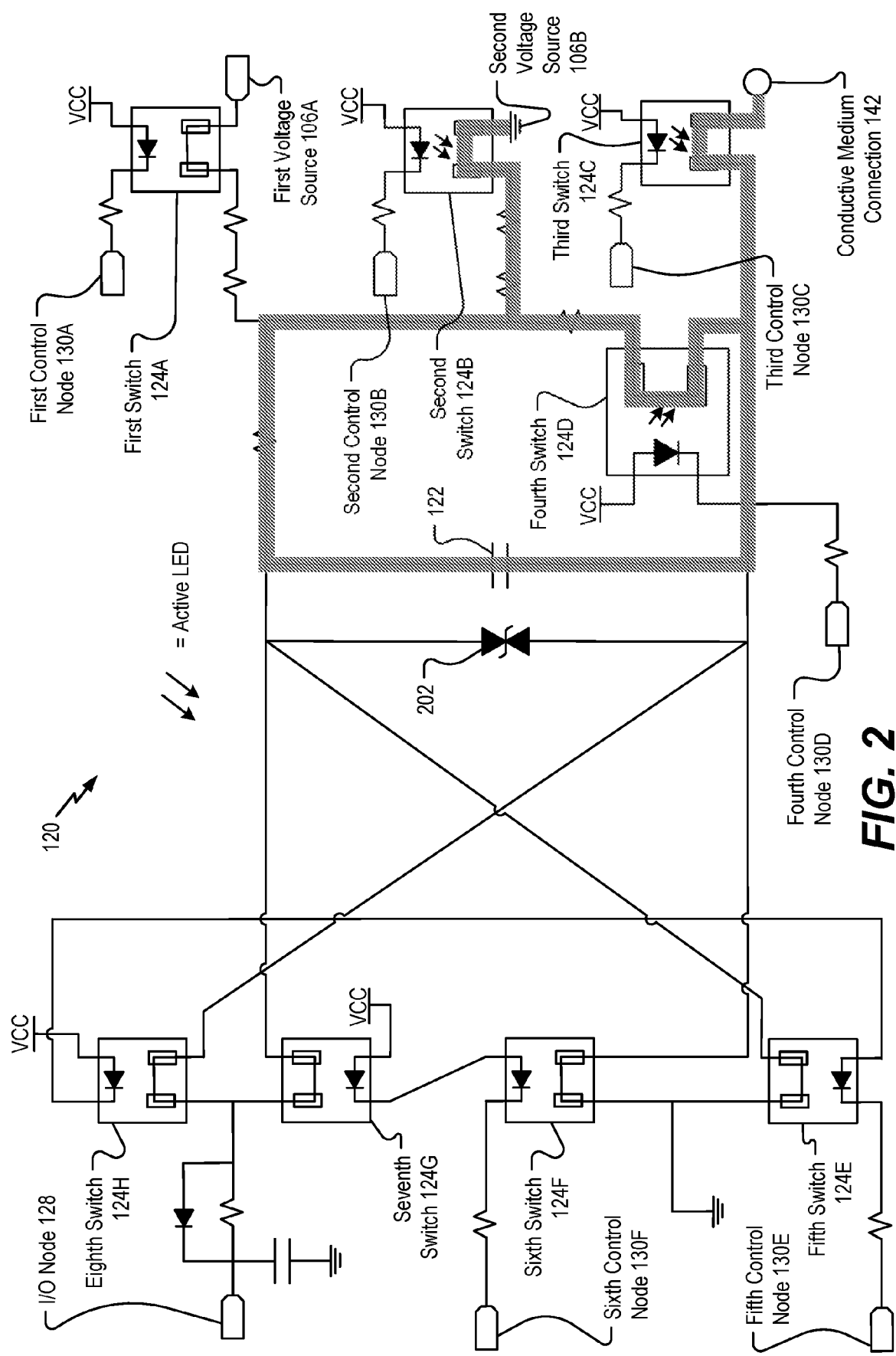
FIG. 2 is a diagram of the circuit of FIG. 1 in a first operational state.

FIG. 2 is a diagram of an example of the circuit 120 in a first operational state. The first operational state illustrated in FIG. 2 corresponds to at least partially discharging the capacitor 122 and the energy storage component(s) 104 of the primary circuitry 150 of FIG. 1. In the example illustrated in FIG. 2, the second switch 124B, the third switch 124C, and the fourth switch 124D are closed in the first operational state. Further, the first switch 124A, the fifth switch 124E, the sixth switch 124F, the seventh switch 124G, and the eighth switch 124H are open in the first operational state. In this state, the capacitor 122 and energy storage component(s) 104 between the circuit 120 and the second voltage source 106B can be at least partially discharged via the resistive path provided by the fourth switch 124D. In an alternative example (not specifically illustrated) of the first operational state, the first switch 124A, the third switch 124C, and the fourth switch 124D are closed, and the second switch 124B, the fifth switch 124E, the sixth switch 124F, the seventh switch 124G, and the eighth switch 124H are open. In this alternative example, the capacitor 122 and energy storage component(s) 104 between the circuit 120 and the first voltage source 106A can be at least partially discharged via the resistive path provided by the fourth switch 124D. In other words, the fourth switch 124D can selectively provide a resistive discharge path.

Figure 3:
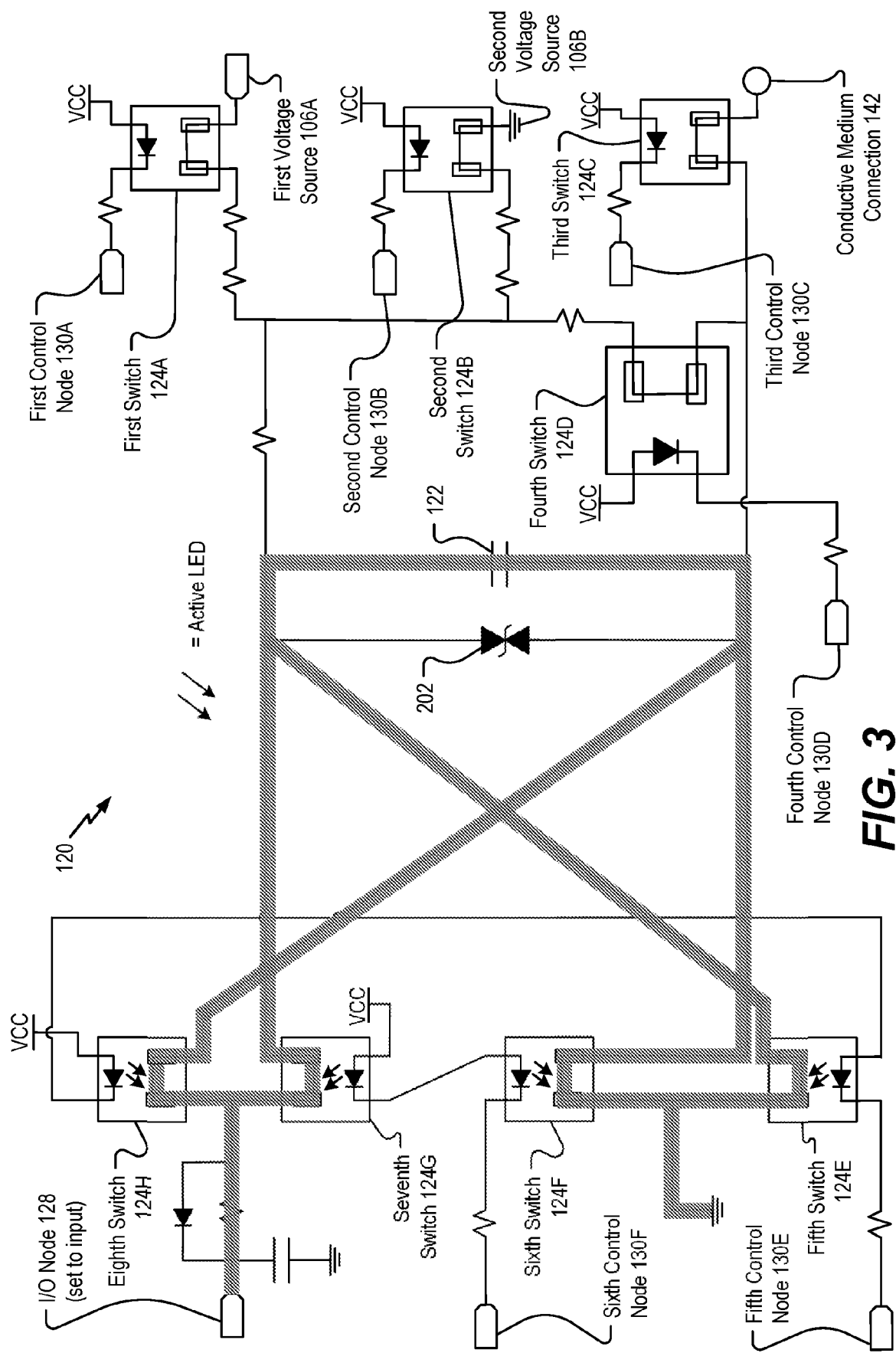
FIG. 3 is a diagram of the circuit of FIG. 1 in a second operational state.

FIG. 3 is a diagram of an example of the circuit 120 in a second operational state. The second operational state illustrated in FIG. 3 corresponds to at least partially discharging the capacitor 122. In some implementations, the controller 108 controls the switches 124 to put the circuit 120 in the second operational state after the circuit has been in the first operational state for a first duration specified in the settings 114. For example, as explained above, the first operational state enables at least partial discharge of the capacitor 122 and the energy storage component(s) 104 of the primary circuitry 150 of the electronic device 102. However, in some circumstances, the capacitor 122 may not be fully or sufficiently discharged in the first operational state. In such circumstances, the second operational state can be used to more completely discharge the capacitor 122.

In the second operational state, the first switch 124A, the second switch 124B, the third switch 124C, and the fourth switch 124D are open, and the fifth switch 124E, the sixth switch 124F, the seventh switch 124G, and the eighth switch 124H are closed. Further, the I/O node 128 is set to an input state, which is a high-impedance state. Accordingly, in the second operational state, both terminals of the capacitor 122 are coupled to ground to at least partially discharge the capacitor 122.

Figure 4:
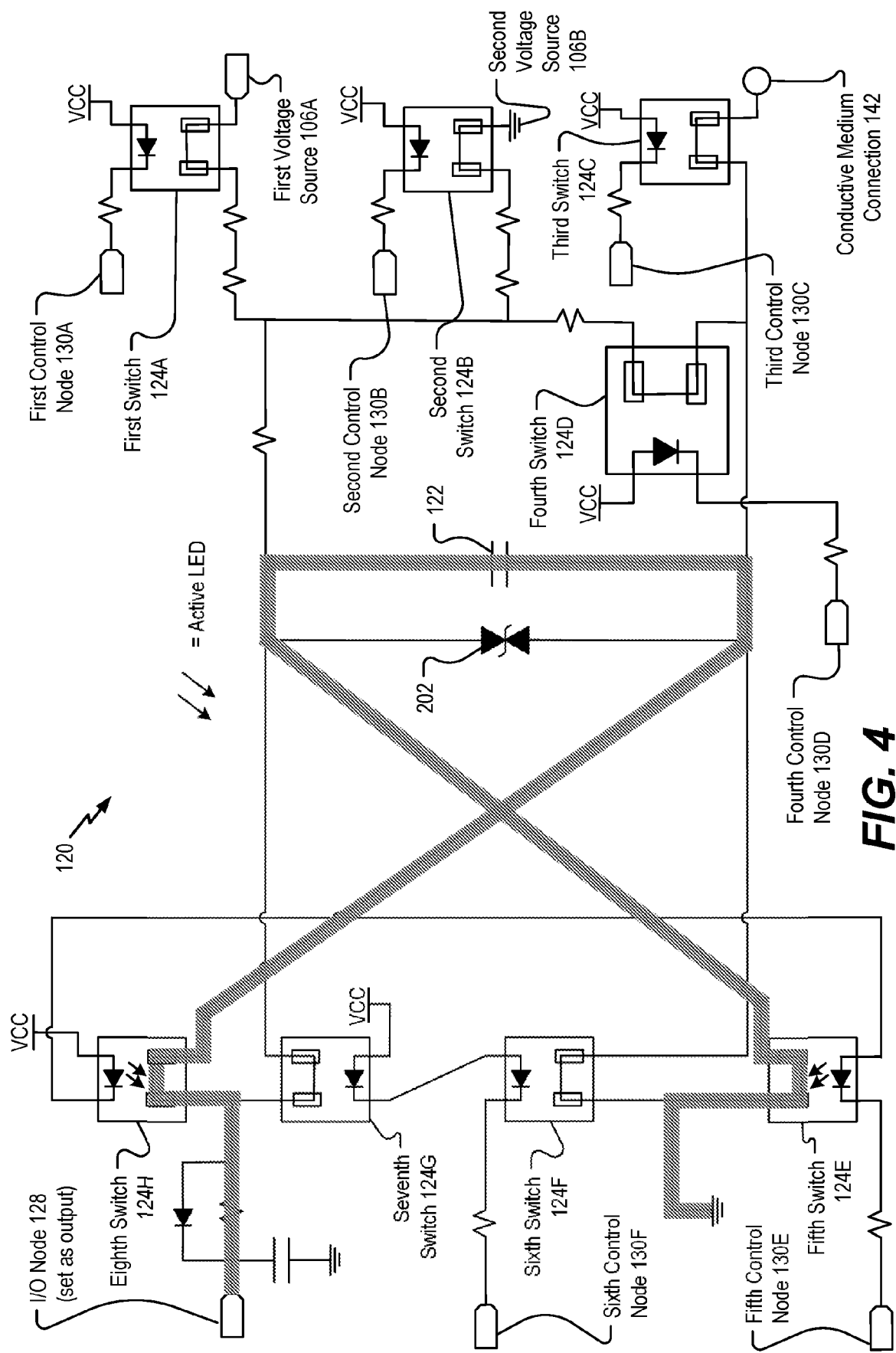
FIG. 4 is a diagram of the circuit of FIG. 1 in a third operational state.

FIG. 4 is a diagram of an example of the circuit 120 in a third operational state. The third operational state illustrated in FIG. 4 corresponds to setting the capacitor 122 to a known state. In some implementations, the controller 108 controls the switches 124 to put the circuit 120 in the third operational state after the circuit 120 has been in the second operational state for a second duration specified in the settings 114.

In the third operational state, the first switch 124A, the second switch 124B, the third switch 124C, the fourth switch 124D, the sixth switch 124F, and the seventh switch 124G are open, and the fifth switch 124E and the eighth switch 124H are closed. Further, the I/O node 128 is set to an output state and a voltage having a voltage level specified in the settings 114 is applied to the I/O node 128. Accordingly, energy is stored in the capacitor 122 responsive to the voltage applied to the I/O node 128.

Figure 5:
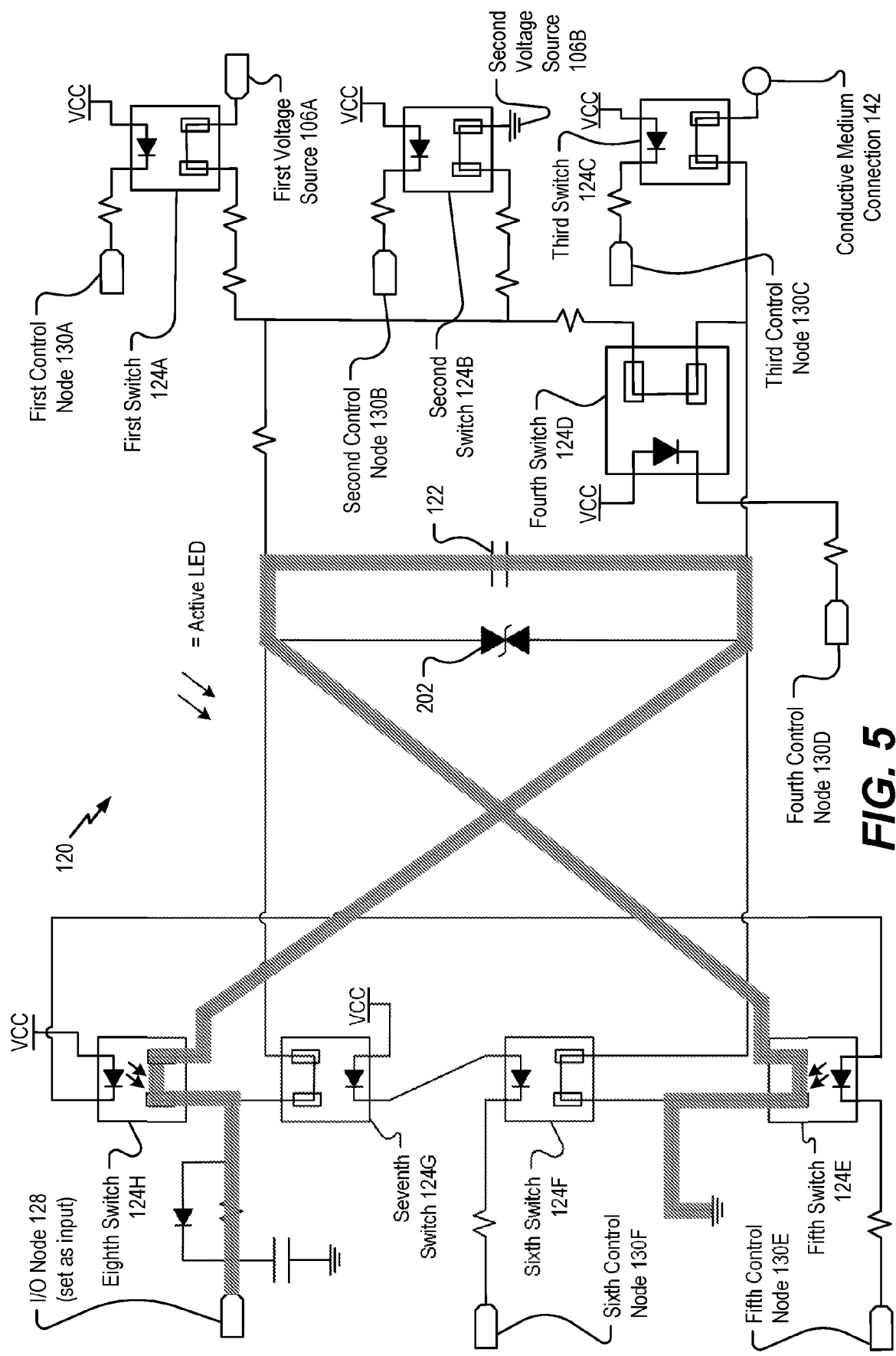
FIG. 5 is a diagram of the circuit of FIG. 1 in a fourth operational state.

FIG. 5 is a diagram of an example of the circuit 120 in a fourth operational state. The fourth operational state illustrated in FIG. 5 corresponds to measuring a voltage level of the capacitor 122. In some implementations, the controller 108 controls the switches 124 to put the circuit 120 in the fourth operational state after the circuit 120 has been in the third operational state for a third duration specified in the settings 114.

In the fourth operational state, the switches 124 are in the same configuration as in the third operational state, and the I/O node 128 is set to the input state enabling the processing circuit 126 to measure a voltage level of the capacitor 122.

Figure 6A:
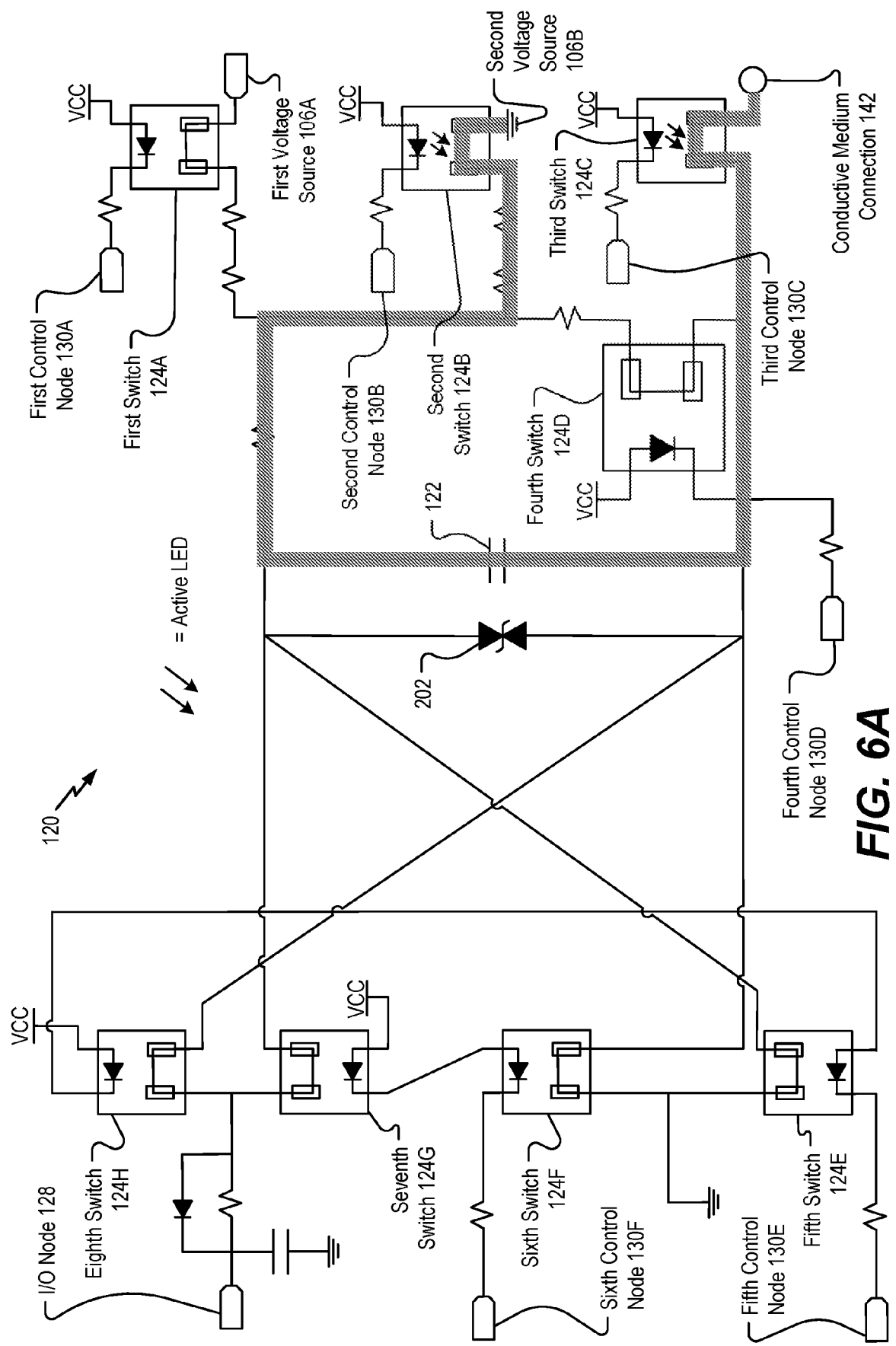
FIG. 6A is a diagram of the circuit of FIG. 1 in a fifth operational state.
Figure 6B:
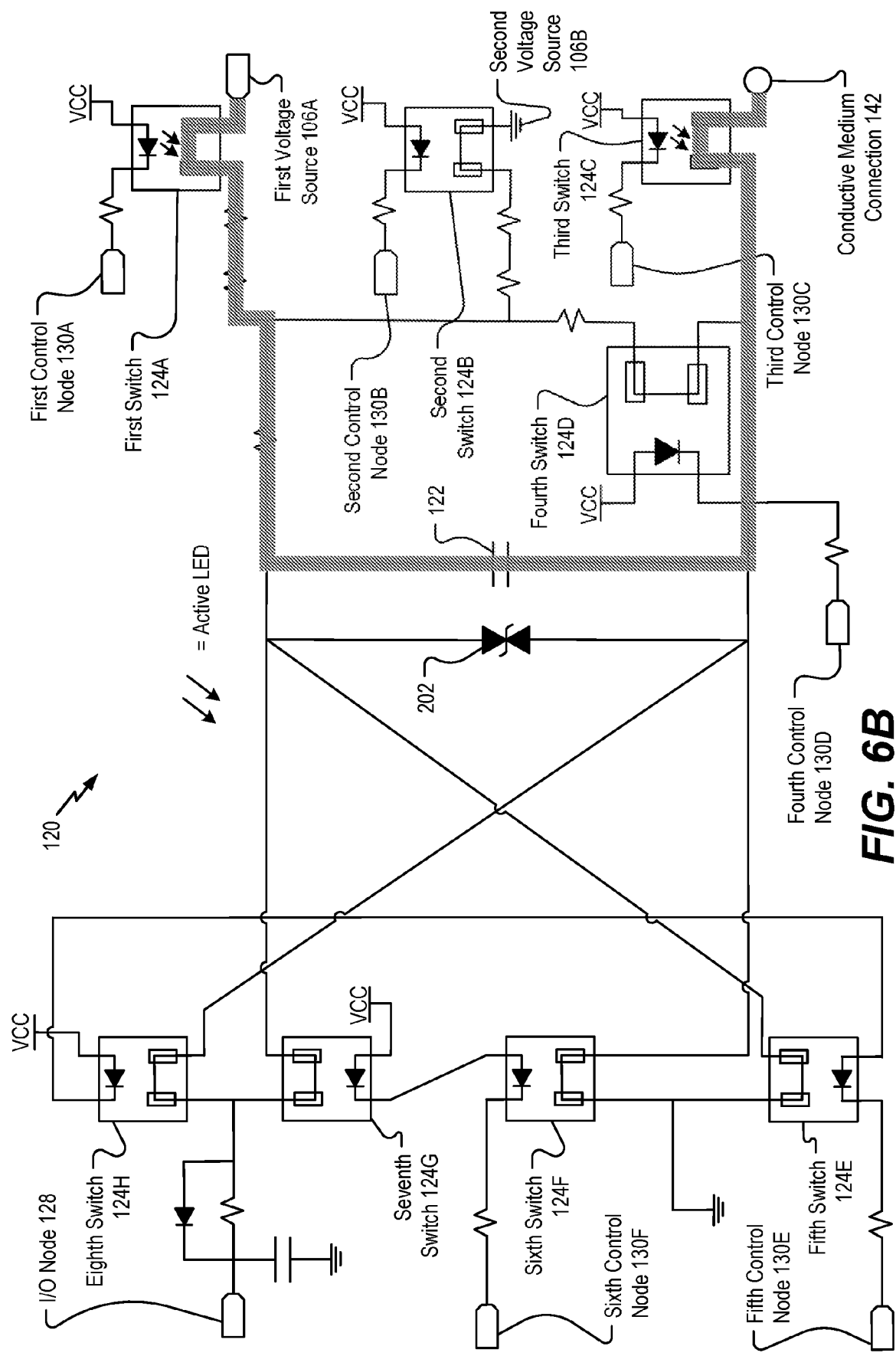
FIG. 6B is a diagram of the circuit of FIG. 1 in an alternative fifth operational state.

FIGS. 6A and 6B are diagrams of examples of the circuit 120 in a fifth operational state. The fifth operational state illustrated in FIGS. 6A and 6B corresponds to connecting the capacitor 122 to a potential leakage path. In particular, the fifth operational state of FIG. 6A can be used to determine whether a leakage path is present between the second voltage source 106B and the conductive medium 140 of FIG. 1, and the fifth operational state of FIG. 6B can be used to determine whether a leakage path is present between the first voltage source 106A and the conductive medium 140. In some implementations, the controller 108 controls the switches 124 to put the circuit 120 in the fifth operational state after the circuit 120 has been in the fourth operational state for a fourth duration specified in the settings 114.

In the fifth operational state illustrated in FIG. 6A, the second switch 124B and the third switch 124C are closed, and the first switch 124A, the fourth switch 124D, the fifth switch 124E, the sixth switch 124F, the seventh switch 124G, and the eighth switch 124H are open. In the fifth operational state illustrated in FIG. 6B, the first switch 124A and the third switch 124C are closed, and the second switch 124B, the fourth switch 124D, the fifth switch 124E, the sixth switch 124F, the seventh switch 124G, and the eighth switch 124H are open.

Figure 7:
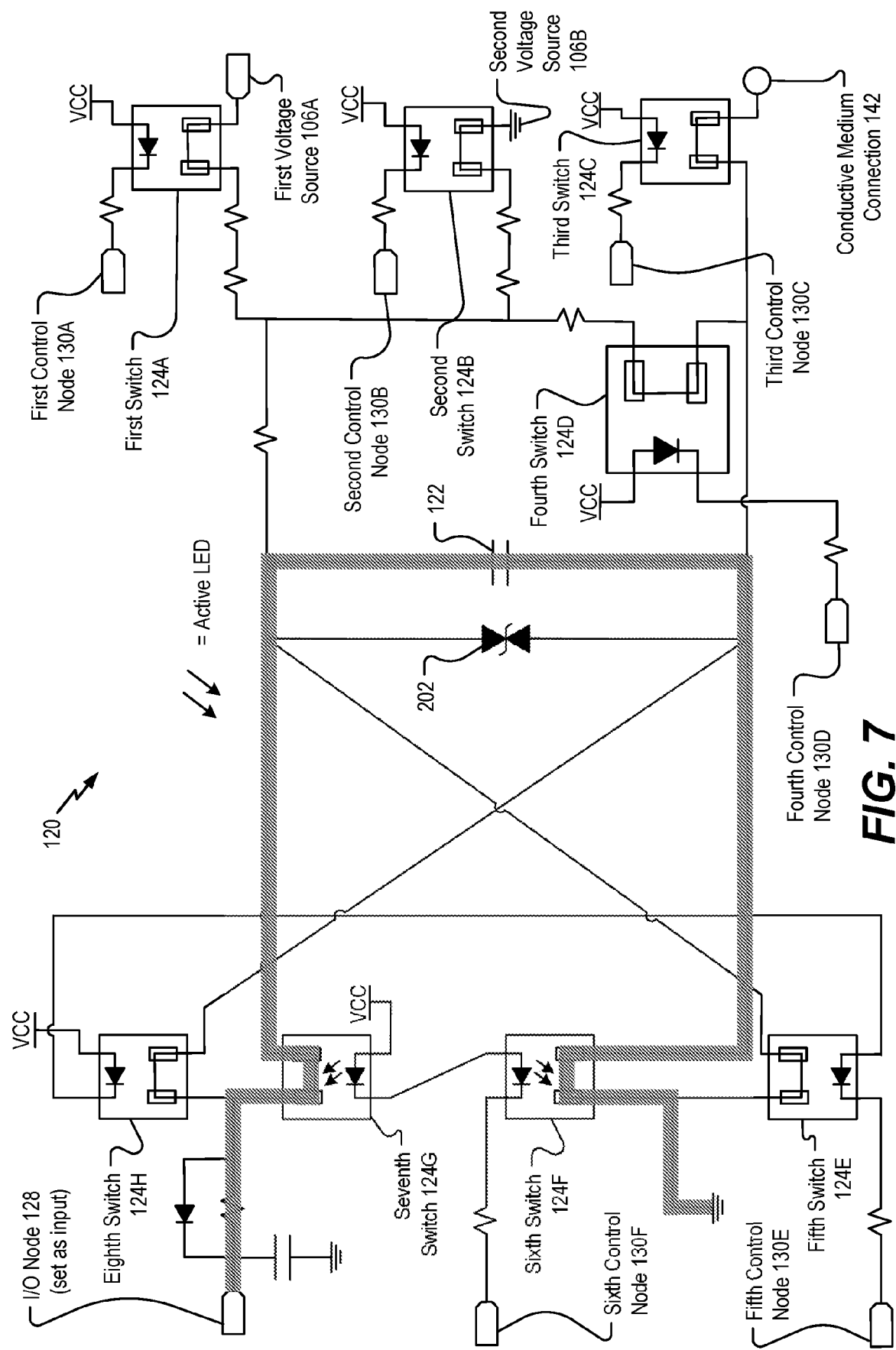
FIG. 7 is a diagram of the circuit of FIG. 1 in a sixth operational state.

FIG. 7 is a diagram of an example of the circuit 120 in a sixth operational state. The sixth operational state illustrated in FIG. 7 corresponds to remeasuring a voltage level of the capacitor 122. In some implementations, the controller 108 controls the switches 124 to put the circuit 120 in the sixth operational state after the circuit 120 has been in the fifth operational state for a fifth duration specified in the settings 114.

In the sixth operational state, the first switch 124A, the second switch 124B, the third switch 124C, the fourth switch 124D, the fifth switch 124E, and the eighth switch 124H are open, and the sixth switch 124F and the seventh switch 124G are closed. Further, the I/O node 128 is set to an input state measure the voltage level of the capacitor 122

In a particular implementation, the measured voltage level of the capacitor 122 determined in the fourth operational state of FIG. 5 and the remeasured voltage level of the capacitor determined in the sixth operational state of FIG. 7 are compared to detect leakage in a potential leakage path. If a difference between the measured voltage level and the remeasured voltage level satisfies a voltage threshold (e.g., is less than or less than or equal to the voltage threshold), the controller 108 determines that no leakage (e.g., no ground fault) is present in the potential leakage path. In this circumstance, a testing cycle associated with the potential leakage path is complete. The testing cycle for the potential leakage path includes iteratively, until an iteration condition is satisfied, causing the capacitor 122 to be set to a known state, measuring a voltage level of the capacitor 122 (and storing data indicating the measured voltage level), causing the capacitor 122 to be connected to a potential leakage path, remeasuring the voltage level of the capacitor 122 (and storing data indicating the remeasured voltage level), and comparing the measured voltage level and the remeasured voltage level to detect leakage in the potential leakage path. In terms of the operational states illustrated in FIGS. 2-7, the testing cycle includes iteratively performing operations that include at least putting the circuit 120 in the third operational state, putting the circuit 120 in the fourth operational state, putting the circuit 120 in the fifth operational state, and putting the circuit 120 in the sixth operational state. In some implementations, the operations of the testing cycle also includes putting the circuit 120 in the second operational state.

The iteration condition is satisfied if the difference between the measured voltage level and the remeasured voltage level satisfies the voltage threshold. However, if the difference between the measured voltage level and the remeasured voltage level fails to satisfy the voltage threshold (e.g., is greater than or greater than or equal to the voltage threshold), the controller 108 determines whether a count of iterations performed in the testing cycle satisfies an iteration threshold. If the count of iterations performed in the testing cycle satisfies the iteration threshold, the controller 108 ends the testing cycle and generates an indication that leakage is present in the potential leakage path (e.g., the controller 108 generates a ground fault indication). If the count of iterations performed in the testing cycle does not satisfy the iteration threshold, the controller 108 continues the testing cycle by performing at least one additional iteration.

In some implementations, the circuit 120 can be used to sequentially test multiple potential leakage paths. For example, the fifth operational state illustrated in FIG. 6A can be used for every iteration of a first testing cycle to test a first potential leakage path between the second voltage source 106B and the conductive medium 140. Subsequently, after determining that the first potential leakage path has a ground fault or after determining that the first potential leakage path does not have a ground fault, the controller 108 can test a second potential leakage path using a second testing cycle. To illustrate, the fifth operational state illustrated in FIG. 6B can be used for every iteration of the second testing cycle to test the second potential leakage path between the first voltage source 106A and the conductive medium 140.

The duration of each operational state can be specified in the settings 114 of FIG. 1 and can be modified responsive to the user input 138. Additionally, or in the alternative, values of the iteration conditions 132 can be modified responsive to the user input 138. Thus, the controller 108 can perform ground fault testing that is customizable to a specific configuration of the electronic device 102. Accordingly, the circuit 120 in conjunction with the controller 108 and the processing circuit 126 enables reliable detection of leakage paths (e.g., ground faults) in the electronic device 102. Further, using the settings 114 as parameters for the firmware 112 to control a leakage detection process allows the circuit 120 to be used to detect leakage paths for a variety of configurations of the primary circuitry 150 of the electronic device 102.

Figure 8:
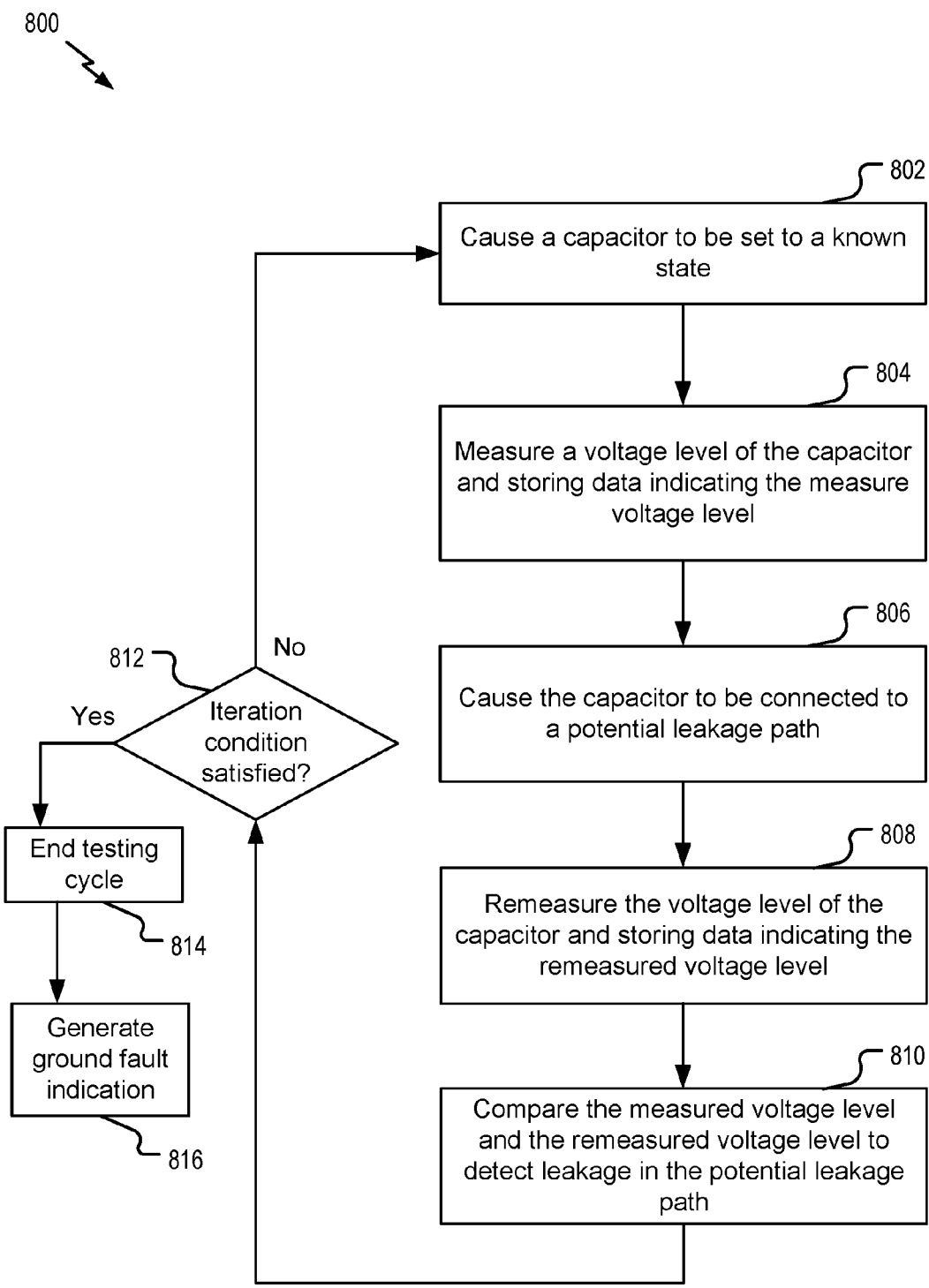
FIG. 8 is a method of detecting a leakage path in a circuit of an electronic device.

FIG. 8 is a flowchart of a method 800 of detecting a leakage path in an electronic device. In an illustrative example, the method 800 can be performed by the controller 108 in conjunction with the circuit 120. As explained below, some of the operations of the method 800 illustrated in FIG. 8 can be performed iteratively, until an iteration condition is satisfied, as part of a testing cycle. In some implementations, the method 800 can include other operations that are performed before the iterative operations or after the iterative operations. As a specific example, in some implementations, before performing an initial iteration of a testing cycle, the method 800 includes at least partially discharging a capacitor and one or more energy storage components of the electronic device 102. In this example, the one or more energy storage components are distinct from the capacitor. For example, the one or more energy storage components 104 are components of the primary circuitry 150 of the electronic device 102, and the capacitor 122 is a component of the circuit 120.

In FIG. 8, the testing cycle of the method 800 includes, at 802, causing the capacitor 122 to be set to a known state. For example, as explained with reference to FIGS. 3 and 4, causing the capacitor 122 to be set to the known state can include at least partially discharging the capacitor 122 and coupling the capacitor 122 to a voltage source associated with a specified voltage level (e.g., the I/O node 128 of the processing circuit 126).

The method 800 includes, at 804, measuring a voltage level of the capacitor and storing data indicating the measured voltage level. For example, as described with reference to FIG. 5, the I/O node 128 of the processing circuit 126 can be set to the input mode to measure the voltage level of the capacitor 122. The processing circuit 126 or the controller 108 can store data indicating the measured voltage level of the capacitor 122 at the memory 110 as an entry of the voltage measurement data 134.

The method 800 also includes, at 806, causing the capacitor to be connected to a potential leakage path. For example, the switches 124 of the circuit 120 can be configured as illustrated in FIG. 6A to connect the capacitor 122 to a potential leakage path between the second voltage source 106B and the conductive medium 140. Alternatively, the switches 124 of the circuit 120 can be configured as illustrated in FIG. 6B to connect the capacitor 122 to a potential leakage path between the first voltage source 106A and the conductive medium 140. In particular implementations, measuring the voltage level of the capacitor includes causing the capacitor to be connected to a node of a processing circuit, such as to the I/O node 128 of the processing circuit 126. In such implementations, the method 800 also includes, before causing the capacitor to be connected to the potential leakage path, causing the capacitor to be disconnected from the node of the processing circuit. Disconnecting the capacitor from the processing circuit before connecting the capacitor to the potential leakage path maintains electrical isolation between the potential leakage path and the processing circuit.

The method 800 includes, at 808, remeasuring the voltage level of the capacitor and storing data indicating the remeasured voltage level. For example, as described with reference to FIG. 7, the I/O node 128 of the processing circuit 126 can be set to the input mode to measure the voltage level of the capacitor 122. The processing circuit 126 or the controller 108 can store data indicating the remeasured voltage level of the capacitor 122 at the memory 110 as an entry of the voltage measurement data 134. In particular implementations, remeasuring the voltage level of the capacitor includes causing the capacitor to be connected to the node of the processing circuit, such as to the I/O node 128 of the processing circuit 126. In such implementations, the method 800 also includes, before remeasuring the voltage level of the capacitor, causing the capacitor to be disconnected from the potential leakage path. Disconnecting the capacitor from the potential leakage path before connecting the capacitor to the processing circuit maintains electrical isolation between the potential leakage path and the processing circuit.

The method 800 further includes, at 810, comparing the measured voltage level and the remeasured voltage level to detect leakage in the potential leakage path. The method 800 also includes, at 812, determining whether an iteration condition is satisfied. As an example, the iteration condition is satisfied when a difference between the measured voltage level and the remeasured voltage level satisfies a voltage threshold or when a count of iterations performed satisfies an iteration threshold. If no iteration condition is satisfied, the method 800 continues by performing another iteration. If an iteration condition is satisfied, the method 800 includes, at 814, ending the testing cycle. In some implementations, the method 800 also includes, at 816, generating a ground fault indication based on a result of the testing cycle. For example, if the testing cycle detected leakage, the controller 108 can send an indication, via the I/O port 136, of a detected ground fault. As another example, if the testing cycle did not detected leakage, the controller 108 can send an indication, via the I/O port 136, of no ground fault.

In some implementations, the method 800 also include, before performing an initial iteration of a testing cycle, receiving user input to specify a duration of one or more of the operations to be performed during the testing cycle. For example, the user input can specify a duration of one or more of the causing the capacitor to be set to the known state, the measuring the voltage level of the capacitor, the causing the capacitor to be connected to the potential leakage path, or the remeasuring the voltage level of the capacitor.

Some features of the illustrative examples are described in the following clauses. These clauses are examples of features not intended to limit other illustrative examples.

Clause 1:

A method of detecting a leakage path in an electronic device, the method comprising:

iteratively, until an iteration condition is satisfied, performing:

causing a capacitor to be set to a known state;

measuring a voltage level of the capacitor and storing data indicating the measured voltage level;

causing the capacitor to be connected to a potential leakage path;

remeasuring the voltage level of the capacitor and storing data indicating the remeasured voltage level; and comparing the measured voltage level and the remeasured voltage level to detect leakage in the potential leakage path, wherein the iteration condition is satisfied when a difference between the measured voltage level and the remeasured voltage level satisfies a voltage threshold or when a count of iterations performed satisfies an iteration threshold.

Clause 2:

The method of clause 1, wherein causing the capacitor to be set to the known state comprises at least partially discharging the capacitor and coupling the capacitor to a voltage source associated with a specified voltage level.

Clause 3:

The method of clause 1 or clause 2, further comprising, before performing an initial iteration, at least partially discharging the capacitor and one or more energy storage components of the electronic device, the one or more energy storage components distinct from the capacitor.

Clause 4:

The method of any one of clauses 1 to 3, wherein the electronic device includes one or more energy storage components distinct from the capacitor, and wherein, during at least one iteration, current flows from the capacitor to charge the one or more energy storage components when the capacitor is connected to the potential leakage path.

Clause 5:

The method of any one of clauses 1 to 4, further comprising receiving user input to specify a duration of one or more of the causing the capacitor to be set to the known state, the measuring the voltage level of the capacitor, the causing the capacitor to be connected to the potential leakage path, or the remeasuring the voltage level of the capacitor.

Clause 6:

The method of any one of clauses 1 to 5, wherein measuring the voltage level of the capacitor includes causing the capacitor to be connected to a node of a processing circuit, and further comprising, before causing the capacitor to be connected to the potential leakage path, causing the capacitor to be disconnected from the node of the processing circuit.

Clause 7:

The method of any one of clauses 1 to 6, wherein remeasuring the voltage level of the capacitor includes causing the capacitor to be connected to the node of the processing circuit, and further comprising, before remeasuring the voltage level of the capacitor, causing the capacitor to be disconnected from the potential leakage path.

Clause 8:

An apparatus comprising:

a circuit to test a potential leakage path in an electronic device, the circuit including a capacitor; and a controller operable to execute firmware to iteratively, until an iteration condition is satisfied, perform operations comprising:

causing the capacitor to be set to a known state;

measuring a voltage level of the capacitor and storing data indicating the measured voltage level;

causing the capacitor to be connected to the potential leakage path;

remeasuring the voltage level of the capacitor and storing data indicating the remeasured voltage level; and comparing the measured voltage level and the remeasured voltage level to detect leakage in the potential leakage path, wherein the iteration condition is satisfied when a difference between the measured voltage level and the remeasured voltage level satisfies a voltage threshold or when a count of iterations performed satisfies an iteration threshold.

Clause 9:

The apparatus of clause 8, wherein the circuit further comprises:

a first switch to selectively couple a first voltage source to the circuit;

a second switch to selectively couple a second voltage source to the circuit;

a third switch to selectively couple a conductive medium connection to the circuit;

a fourth switch to selectively provide a resistive discharge path;

a fifth switch to selectively couple a ground to the circuit;

a sixth switch to selectively couple the ground to the circuit;

a seventh switch to selectively couple the capacitor to a node of a processing circuit; and an eighth switch to selectively couple the capacitor to the node of the processing circuit.

Clause 10:

The apparatus of clause 9, wherein causing the capacitor to be set to the known state comprises at least partially discharging the capacitor by causing the fifth switch, the sixth switch, or both, to couple the capacitor to the ground, setting the node of the processing circuit to an input state, and causing the seventh switch, the eighth switch, or both, to couple the capacitor to the node.

Clause 11:

The apparatus of clause 9 or clause 10, wherein causing the capacitor to be set to the known state further comprises, after at least partially discharging the capacitor, charging the capacitor by setting the node of the processing circuit to an output state and causing the seventh switch, the eighth switch, or both, to couple the capacitor to the node.

Clause 12:

The apparatus of any one of clauses 9 to 11, wherein measuring a voltage level of the capacitor comprises causing the fifth switch, the sixth switch, or both, to couple the capacitor to the ground, setting the node of the processing circuit to an input state, and causing the seventh switch, the eighth switch, or both, to couple the capacitor to the node.

Clause 13:

The apparatus of any one of clauses 9 to 12, wherein causing the capacitor to be connected to the potential leakage path comprises causing the first switch to couple the capacitor to the first voltage source and causing the third switch to couple the capacitor to the conductive medium connection.

Clause 14:

The apparatus of any one of clauses 9 to 13, wherein causing the capacitor to be connected to the potential leakage path comprises causing the second switch to couple the capacitor to the second voltage source and causing the third switch to couple the capacitor to the conductive medium connection.

Clause 15:

The apparatus of any one of clauses 9 to 14, further comprising a memory storing one or more settings, the one or more settings indicating a duration of one or more of the causing the capacitor to be set to the known state, the measuring the voltage level of the capacitor, the causing the capacitor to be connected to the potential leakage path, or the remeasuring the voltage level of the capacitor.

Clause 16:

The apparatus of clause 15, wherein the one or more settings are configurable via user input based on a configuration of the electronic device.

Clause 17:

The apparatus of clause 15 or clause 16, wherein the one or more setting further comprise the iteration threshold, wherein the iteration threshold is configurable via user input based on a configuration of the electronic device.

Clause 18:

The apparatus of any one of clauses 15 to 17, wherein the one or more settings further comprise a voltage level of a voltage applied to the capacitor to cause the capacitor to be set to a known state, wherein the voltage level is configurable via user input based on a configuration of the electronic device.

Clause 19:

The apparatus of any one of clauses 15 to 18, wherein the one or more settings further comprise the voltage threshold, wherein the voltage threshold is configurable via user input based on a configuration of the electronic device.

Clause 20:

A non-transitory computer-readable medium comprising firmware that, when executed by a controller of an electronic device, causes the controller to iteratively, until an iteration condition is satisfied, perform operations comprising:

causing a capacitor to be set to a known state;

measuring a voltage level of the capacitor and storing data indicating the measured voltage level;

causing the capacitor to be connected to a potential leakage path;

remeasuring the voltage level of the capacitor and storing data indicating the remeasured voltage level; and comparing the measured voltage level and the remeasured voltage level to detect leakage in the potential leakage path, wherein the iteration condition is satisfied when a difference between the measured voltage level and the remeasured voltage level satisfies a voltage threshold or when a count of iterations performed satisfies an iteration threshold.

The illustrations of the examples described herein are intended to provide a general understanding of the structure of the various implementations. The illustrations are not intended to serve as a complete description of all of the elements and features of apparatus and systems that utilize the structures or methods described herein. Many other implementations may be apparent to those of skill in the art upon reviewing the disclosure. Other implementations may be utilized and derived from the disclosure, such that structural and logical substitutions and changes may be made without departing from the scope of the disclosure. For example, method operations may be performed in a different order than shown in the figures or one or more method operations may be omitted. Accordingly, the disclosure and the figures are to be regarded as illustrative rather than restrictive.

Moreover, although specific examples have been illustrated and described herein, it should be appreciated that any subsequent arrangement designed to achieve the same or similar results may be substituted for the specific implementations shown. This disclosure is intended to cover any and all subsequent adaptations or variations of various implementations. Combinations of the above implementations, and other implementations not specifically described herein, will be apparent to those of skill in the art upon reviewing the description.

The Abstract of the Disclosure is submitted with the understanding that it will not be used to interpret or limit the scope or meaning of the claims. In addition, in the foregoing Detailed Description, various features may be grouped together or described in a single implementation for the purpose of streamlining the disclosure. Examples described above illustrate but do not limit the disclosure. It should also be understood that numerous modifications and variations are possible in accordance with the principles of the present disclosure. As the following claims reflect, the claimed subject matter may be directed to less than all of the features of any of the disclosed examples. Accordingly, the scope of the disclosure is defined by the following claims and their equivalents.

What is claimed is:

1. A method of detecting a leakage path in an electronic device, the method comprising:
    iteratively, until an iteration condition is satisfied, performing:
    causing a capacitor to be set to a known state;
measuring a voltage level of the capacitor and storing data indicating a measured voltage level;
    causing the capacitor to be connected to a potential leakage path;
    remeasuring the voltage level of the capacitor and storing data indicating a remeasured voltage level;
    comparing the measured voltage level and the remeasured voltage level to detect leakage in the potential leakage path; and
    before performing an initial iteration, at least partially discharging the capacitor and one or more energy storage components of the electronic device, the one or more energy storage components distinct from the capacitor;
    wherein the iteration condition is satisfied when a difference between the measured voltage level and the remeasured voltage level satisfies a voltage threshold or when a count of iterations performed satisfies an iteration threshold.

2. The method of claim 1, wherein causing the capacitor to be set to the known state comprises at least partially discharging the capacitor and coupling the capacitor to a voltage source associated with a specified voltage level.

3. A method of detecting a leakage path in an electronic device, the method comprising:
    iteratively, until an iteration condition is satisfied, performing:
    causing a capacitor to be set to a known state;
measuring a voltage level of the capacitor and storing data indicating a measured voltage level;
    causing the capacitor to be connected to a potential leakage path;
    remeasuring the voltage level of the capacitor and storing data indicating a remeasured voltage level; and
    comparing the measured voltage level and the remeasured voltage level to detect leakage in the potential leakage path;
    wherein the iteration condition is satisfied when a difference between the measured voltage level and the remeasured voltage level satisfies a voltage threshold or when a count of iterations performed satisfies an iteration threshold;
    wherein the electronic device includes one or more energy storage components distinct from the capacitor, and wherein, during at least one iteration, current flows from the capacitor to charge the one or more energy storage components when the capacitor is connected to the potential leakage path.

4. A method of detecting a leakage path in an electronic device, the method comprising:
    iteratively, until an iteration condition is satisfied, performing:
    causing a capacitor to be set to a known state;
measuring a voltage level of the capacitor and storing data indicating a measured voltage level;
    causing the capacitor to be connected to a potential leakage path;
    remeasuring the voltage level of the capacitor and storing data indicating a remeasured voltage level;
    comparing the measured voltage level and the remeasured voltage level to detect leakage in the potential leakage path; and
    receiving user input to specify a duration of one or more of: the causing of the capacitor to be set to the known state, the measuring of the voltage level of the capacitor, the causing of the capacitor to be connected to the potential leakage path, or the remeasuring of the voltage level of the capacitor;
    wherein the iteration condition is satisfied when a difference between the measured voltage level and the remeasured voltage level satisfies a voltage threshold or when a count of iterations performed satisfies an iteration threshold.

5. The method of claim 1, wherein remeasuring the voltage level of the capacitor includes causing the capacitor to be connected to a node of a processing circuit, and further comprising, before causing the capacitor to be connected to the potential leakage path, causing the capacitor to be disconnected from the node of the processing circuit.

6. A method of detecting a leakage path in an electronic device, the method comprising:
    iteratively, until an iteration condition is satisfied, performing:
    causing a capacitor to be set to a known state;
measuring a voltage level of the capacitor and storing data indicating a measured voltage level;
    causing the capacitor to be connected to a potential leakage path;
    remeasuring the voltage level of the capacitor and storing data indicating a remeasured voltage level; and
    comparing the measured voltage level and the remeasured voltage level to detect leakage in the potential leakage path;
    wherein the iteration condition is satisfied when a difference between the measured voltage level and the remeasured voltage level satisfies a voltage threshold or when a count of iterations performed satisfies an iteration threshold;
    wherein remeasuring the voltage level of the capacitor includes causing the capacitor to be connected to a node of a processing circuit, and further comprising, before remeasuring the voltage level of the capacitor, causing the capacitor to be disconnected from the potential leakage path.

7. An apparatus comprising:
    a circuit to test a potential leakage path in an electronic device, the circuit including
    a capacitor;
    a first switch to selectively couple a first voltage source to the circuit;
    a second switch to selectively couple a second voltage source to the circuit;
    a third switch to selectively couple a conductive medium connection to the circuit;
    a fourth switch to selectively provide a resistive discharge path;
    a fifth switch to selectively couple a ground to the circuit;
    a sixth switch to selectively couple the ground to the circuit;

a seventh switch to selectively couple the capacitor to a node of a processing circuit; and an eighth switch to selectively couple the capacitor to the node of the processing circuit; and a controller operable to execute firmware to iteratively, until an iteration condition is satisfied, perform operations comprising:

causing the capacitor to be set to a known state;

measuring a voltage level of the capacitor and storing data indicating a measured voltage level;

causing the capacitor to be connected to the potential leakage path;

remeasuring the voltage level of the capacitor and storing data indicating a remeasured voltage level; and comparing the measured voltage level and the remeasured voltage level to detect leakage in the potential leakage path;

wherein the iteration condition is satisfied when a difference between the measured voltage level and the remeasured voltage level satisfies a voltage threshold or when a count of iterations performed satisfies an iteration threshold.

8. The apparatus of claim 7, wherein causing the capacitor to be set to the known state comprises at least partially discharging the capacitor by causing the fifth switch, the sixth switch, or both, to couple the capacitor to the ground, setting the node of the processing circuit to an input state, and causing the seventh switch, the eighth switch, or both, to couple the capacitor to the node.

9. The apparatus of claim 7, wherein causing the capacitor to be set to the known state further comprises, after at least partially discharging the capacitor, charging the capacitor by setting the node of the processing circuit to an output state and causing the seventh switch, the eighth switch, or both, to couple the capacitor to the node.

10. The apparatus of claim 7, wherein remeasuring the voltage level of the capacitor comprises causing the fifth switch, the sixth switch, or both, to couple the capacitor to the ground, setting the node of the processing circuit to an input state, and causing the seventh switch, the eighth switch, or both, to couple the capacitor to the node.

11. The apparatus of claim 7, wherein causing the capacitor to be connected to the potential leakage path comprises causing the first switch to couple the capacitor to the first voltage source and causing the third switch to couple the capacitor to the conductive medium connection.

12. The apparatus of claim 7, wherein causing the capacitor to be connected to the potential leakage path comprises causing the second switch to couple the capacitor to the second voltage source and causing the third switch to couple the capacitor to the conductive medium connection.

13. The apparatus of claim 7, further comprising a memory storing one or more settings, the one or more settings indicating a duration of one or more of the causing of the capacitor to be set to the known state, the measuring of the voltage level of the capacitor, the causing of the capacitor to be connected to the potential leakage path, or the remeasuring of the voltage level of the capacitor.

14. The apparatus of claim 13, wherein the one or more settings are configurable via user input based on a configuration of the electronic device.

15. The apparatus of claim 13, wherein the one or more setting further comprise the iteration threshold, wherein the iteration threshold is configurable via user input based on a configuration of the electronic device.

16. The apparatus of claim 13, wherein the one or more settings further comprise a voltage level of a voltage applied to the capacitor to cause the capacitor to be set to the known state, wherein the voltage level is configurable via user input based on a configuration of the electronic device.

17. The apparatus of claim 13, wherein the one or more settings further comprise the voltage threshold, wherein the voltage threshold is configurable via user input based on a configuration of the electronic device.

18. A non-transitory computer-readable medium comprising firmware that, when executed by a controller of an electronic device, causes the controller to iteratively, until an iteration condition is satisfied, perform operations comprising:

causing a capacitor to be set to a known state;

measuring a voltage level of the capacitor and storing data indicating a measured voltage level;

causing the capacitor to be connected to a potential leakage path;

remeasuring the voltage level of the capacitor and storing data indicating a remeasured voltage level;

comparing the measured voltage level and the remeasured voltage level to detect leakage in the potential leakage path; and before performing an initial iteration, at least partially discharging the capacitor and one or more energy storage components of the electronic device, the one or more energy storage components distinct from the capacitor;

wherein the iteration condition is satisfied when a difference between the measured voltage level and the remeasured voltage level satisfies a voltage threshold or when a count of iterations performed satisfies an iteration threshold.

19. The non-transitory computer-readable medium of claim 18, wherein the electronic device includes one or more energy storage components distinct from the capacitor, and wherein, during at least one iteration, current flows from the capacitor to charge the one or more energy storage components when the capacitor is connected to the potential leakage path.

20. The non-transitory computer-readable medium of claim 18, wherein remeasuring the voltage level of the capacitor includes causing the capacitor to be connected to a node of a processing circuit, and further comprising, before remeasuring the voltage level of the capacitor, causing the capacitor to be disconnected from the potential leakage path.

* * * * *